US008366853B2

United States Patent
Liu et al.

(10) Patent No.: US 8,366,853 B2
(45) Date of Patent: Feb. 5, 2013

(54) METHOD FOR MAKING CARBON NANOTUBE FILM

(75) Inventors: Liang Liu, Beijing (CN); Chen Feng, Beijing (CN)

(73) Assignee: Beijing FUNATE Innovation Technology Co., Ltd., Beijing (CN)

(*) Notice: Subject to any disclaimer, the term of this patent is extended or adjusted under 35 U.S.C. 154(b) by 328 days.

(21) Appl. No.: 12/856,541

(22) Filed: Aug. 13, 2010

(65) Prior Publication Data

US 2011/0139361 A1 Jun. 16, 2011

(30) Foreign Application Priority Data

Dec. 11, 2009 (CN) .......................... 2009 1 0250640

(51) Int. Cl.
*B32B 37/00* (2006.01)
(52) U.S. Cl. ........................................ 156/161; 156/184
(58) Field of Classification Search .................. 156/60, 156/184, 160, 161, 230, 247
See application file for complete search history.

(56) References Cited

U.S. PATENT DOCUMENTS

| 7,045,108 | B2 | 5/2006 | Jiang et al. | |
|---|---|---|---|---|
| 2007/0292614 | A1* | 12/2007 | Liu et al. | 427/249.1 |
| 2008/0018012 | A1* | 1/2008 | Lemaire et al. | 264/82 |
| 2008/0248235 | A1 | 10/2008 | Feng et al. | |
| 2009/0208708 | A1 | 8/2009 | Wei et al. | |
| 2011/0278758 | A1 | 11/2011 | Liu et al. | |

FOREIGN PATENT DOCUMENTS

| CN | 1948144 A | 4/2007 |
|---|---|---|
| CN | 101407312 A | 4/2009 |

* cited by examiner

*Primary Examiner* — Jeff Aftergut
(74) *Attorney, Agent, or Firm* — Altis Law Group, Inc.

(57) ABSTRACT

A method for making a carbon nanotube film is disclosed. A carbon nanotube array formed on a continuously curving surface of a growing substrate is provided. A carbon nanotube segment is selected from the carbon nanotube array. The carbon nanotube segment is drawn away from the carbon nanotube array to achieve the carbon nanotube film.

15 Claims, 8 Drawing Sheets

METHOD FOR MAKING CARBON NANOTUBE FILM

CROSS-REFERENCE TO RELATED APPLICATIONS

This application claims all benefits accruing under 35 U.S.C. §119 from China Patent Application No. 200910250640.7, filed on 2009 Dec. 11, in the China Intellectual Property Office, the disclosure of which is incorporated herein by reference. This application is related to commonly-assigned applications entitled, "METHOD FOR MAKING CARBON NANOTUBE STRUCTURE", filed 2010 Aug. 13, 12/855875; "METHOD FOR MAKING CARBON NANOTUBE STRUCTURE", filed 2010 Aug 13, 12/855,879; "METHOD AND APPARATUS FOR FORMING CARBON NANOTUBE ARRAY", filed 2010 Aug. 13, 12/855,883.

BACKGROUND

1. Technical Field

The present disclosure relates to a method for making a carbon nanotube film.

2. Description of Related Art

Recently, as needs increase for forming separate and tiny carbon nanotubes into manipulable carbon nanotube structures, a carbon nanotube film has been fabricated by drawing from a carbon nanotube array disclosed by patent US20080248235A1 to Feng et al. The carbon nanotube film is free standing and includes a plurality of carbon nanotubes joined end-to-end by Van der Waals attractive force therebetween. The carbon nanotubes in the carbon nanotube film are substantially aligned along the lengthwise direction of the carbon nanotube film, and thus, the carbon nanotube film has good properties, such as thermal and electrical conductivities, along the direction of the aligned carbon nanotubes. The carbon nanotube film is substantially transparent and can be used as a conductive thin film. Therefore, the carbon nanotube film can be used in many different fields.

However, size of the carbon nanotube film which is drawn from the carbon nanotube array is restricted by the size of the carbon nanotube array. The carbon nanotube array is grown on a flat surface of a silicon wafer by using a chemical vapor deposition (CVD) method. During the growing of the carbon nanotube array by the CVD method, the inner gas pressure of the tube furnace is less than the atmosphere pressure outside the tube furnace. Therefore, the sidewall of the tube furnace has to bear an inward pressure difference. When the tube furnace with a diameter of about 10 inches and a length of about 2 meters has the inner gas pressure of about 10 torr, the pressure difference between inside and outside of the tube furnace is about 50,000 Newton. However, if the diameter of the tube furnace increased to 40 inches, the pressure difference could reach to about 200,000 Newton. Further, as the increase of the diameter of the tube furnace, the curvature of the sidewall of the tube furnace decreases, and thus weakens the support of the sidewall. Therefore, as the increase of the diameter of the tube furnace, a large inward pressure difference may cause a damage of the tube furnace.

The tube furnace with a larger diameter can hardly be achieved. The conventional tube furnace for growing the carbon nanotube array has a diameter of about 10 inches. Therefore, the silicon wafer disposed inside the tube furnace should have a diameter less than 10 inches, such as 8 inches. The original carbon nanotube film drawn from the carbon nanotube array grown on that 8-inch-silicon-wafer has a width restricted to 8 inches. The diameter of the carbon nanotube wire is also restricted.

What is needed, therefore, is to provide a method for making a carbon nanotube film having relatively large size.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

Figure 1:
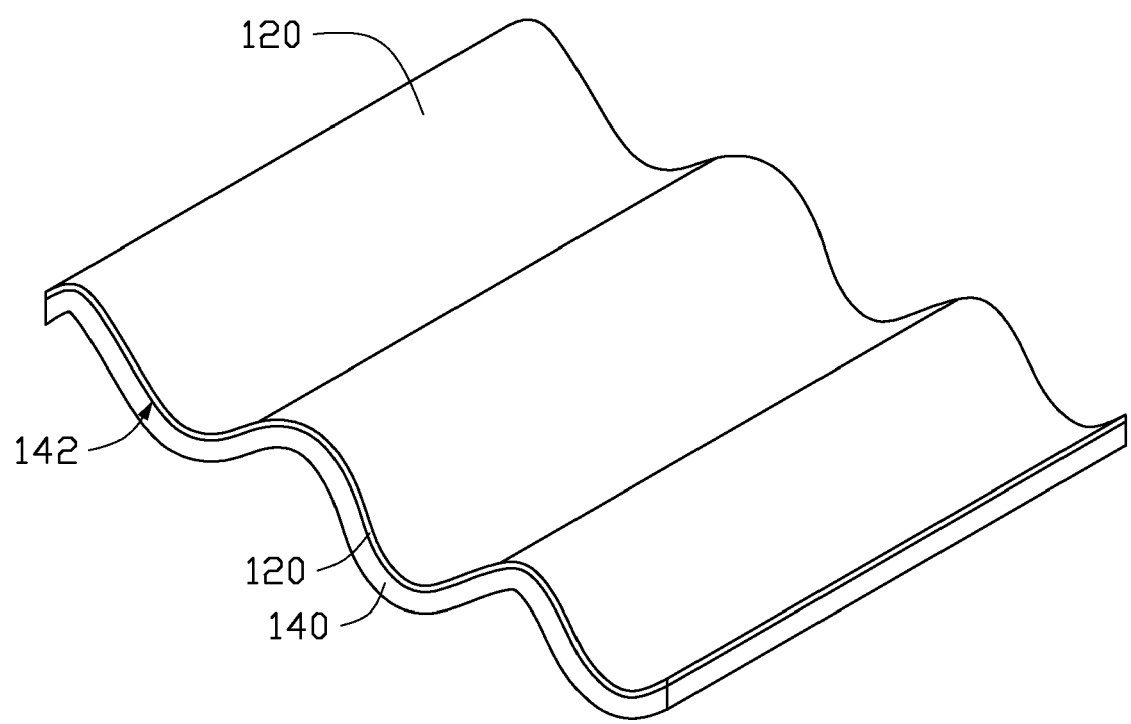
FIG. 1 is a schematic structural view of an embodiment of a wavy growing substrate with a carbon nanotube array formed on a surface thereof.

The disclosure is illustrated by way of example and not by way of limitation in the figures of the accompanying drawings in which like references indicate similar elements. It should be noted that references to "another", "an", or "one" embodiment in this disclosure are not necessarily to the same embodiment, and such references mean at least one.

The present disclosure discloses a method for making a carbon nanotube film including a plurality of carbon nanotube segments joined end-to-end by Van der Waals attractive force therebetween, thereby forming the free-standing carbon nanotube film. The method for making the carbon nanotube film includes steps of:

S1, providing a carbon nanotube array formed on a continuously curving surface of a growing substrate;

S2, selecting a carbon nanotube segment having a predetermined width from the carbon nanotube array using a drawing tool (e.g., adhesive tape, pliers, tweezers, or another tool allowing multiple carbon nanotubes to be gripped and pulled simultaneously); and S3, drawing the carbon nanotube segment away from the carbon nanotube array to achieve the carbon nanotube film.

In step S1, the carbon nanotube array may be grown on the continuously curving surface of the growing substrate by using a CVD method. The carbon nanotube array is capable of having a carbon nanotube film drawn therefrom. In one embodiment, the carbon nanotube array is super aligned and includes a plurality of carbon nanotubes substantially perpendicular to the continuously curving surface of the growing substrate. The carbon nanotube array is essentially free of impurities such as carbonaceous or residual catalyst particles. The carbon nanotubes in the carbon nanotube array are closely packed together by Van der Waals attractive force. Accordingly, a free-standing carbon nanotube film can be drawn from the carbon nanotube array. The carbon nanotube array 120 has a continuously curving layer shape corresponding to the continuously curving surface of the growing substrate. In one embodiment, the method for growing the super aligned carbon nanotube array includes steps of:

(a) providing the growing substrate including a continuously curving surface;
(b) forming a catalyst layer on the continuously curving surface; and
(c) growing the carbon nanotube array on the continuously curving surface of the growing substrate by using the CVD method.

The catalyst layer can be made of iron (Fe), cobalt (Co), nickel (Ni), or any alloy thereof. In one embodiment, the catalyst layer is a Fe layer with a thickness of 5 nanometers. The catalyst layer can be formed by ion plating, depositing, sputtering, or evaporating a metal film on the continuously curving surface of the growing substrate. The metal film can be further annealed to form a plurality of nano sized catalyst grains. An oxidization of metal is occurred during the annealing step, and the metal film is converted to metal oxide of the catalyst grains. In one embodiment, the metal film is annealed at an annealing temperature in an approximate range from 300° C. to 900° C. (e.g., 700° C.) in air for about 30 minutes to about 90 minutes.

In step (c), the growing substrate with the catalyst layer formed on the continuously curving surface thereof can be heated at a growing temperature in an approximate range from about 500° C. to about 900° C. (e.g., 740° C.) in a CVD reacting chamber with a protective gas. A carbon source gas can be supplied into the CVD reacting chamber for about 5 minutes to about 30 minutes at the growing temperature to grow the super-aligned carbon nanotube array from the continuously curving surface of the growing substrate.

The substrate can bear the annealing temperature and growing temperature during the growing of the carbon nanotube array. The material of the substrate can be quartz, high temperature glass, P-type silicon, N-type silicon, or metals with high melting points. In one embodiment, the continuously curving surface of the growing substrate can include a silicon dioxide layer. The surface of the growing substrate can be a smoothly curving surface.

The continuously curving surface can be a cylindrical surface in geometry. The "cylindrical surface" is the surface generated by a straight line, i.e., the generatrix, intersecting and moving along a smooth plane curve, i.e., the directrix, while remaining parallel to a fixed straight line that is not on or parallel to the plane of the directrix. The directrix of the cylindrical surface can be a helix line, a wavy line, or a closed smooth curve, such as a circle. The growing substrate can be a continuously curving sheet including an inner surface and an outer surface, the inner surface and the outer surface can both be continuously curving surfaces.

Referring to FIG. 1, in one embodiment, the continuously curving surface 142 of the growing substrate 140 is a wavy surface defined by the wavy line as the directrix and the generatrix perpendicular to and moving along the wave line. The carbon nanotube array 120 grown on the wavy surface correspondingly has a wavy surface shape.

Figure 2:
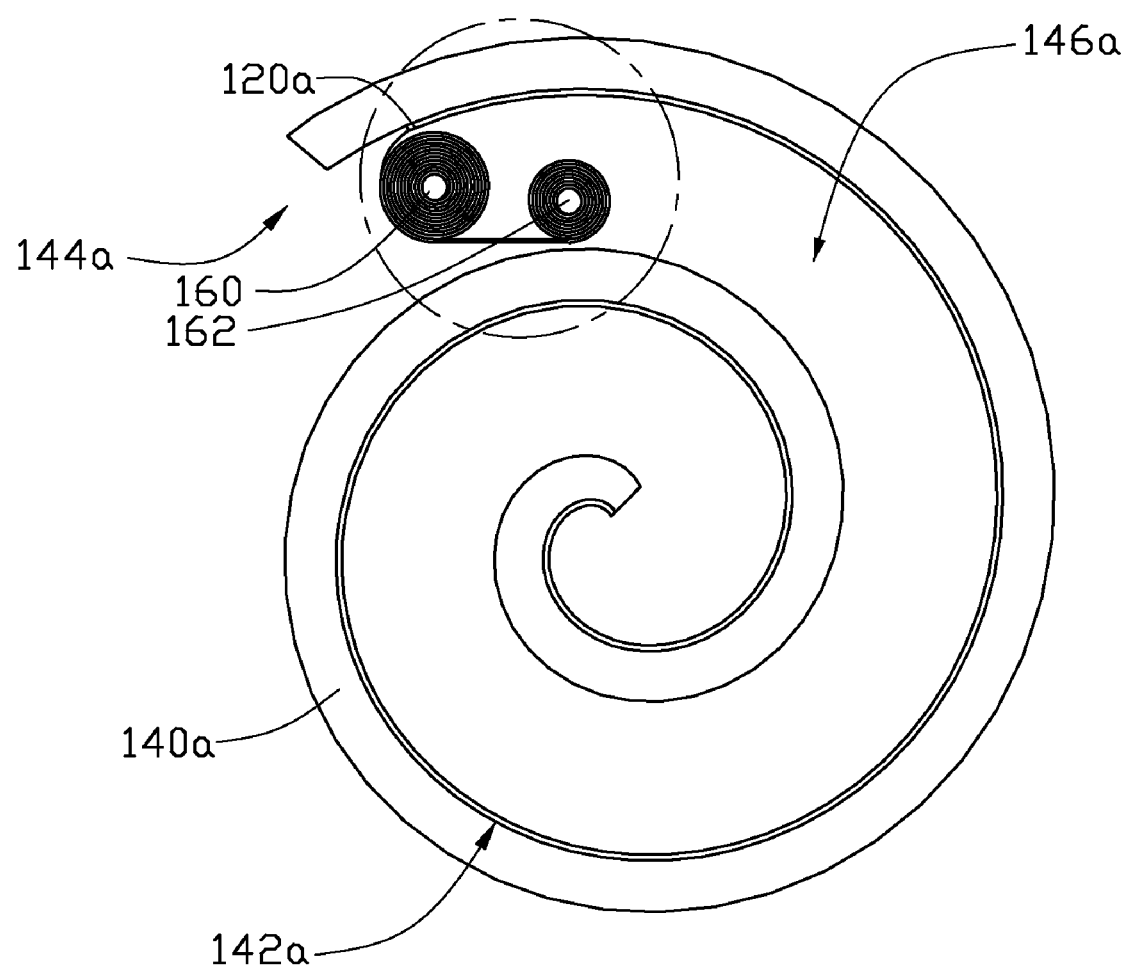
FIG. 2 is a schematic side view of a process of drawing a carbon nanotube film from the carbon nanotube array formed on a surface of a helical growing substrate.

Referring to FIG. 2, in another embodiment, the growing substrate 140a is a helical-shaped structure, the continuously curving surface 142a of the growing substrate 140a is a helical surface defined by the helix line (i.e., helical directrix) and the generatrix perpendicular to and moving along the helical directrix. The continuously curving surface 142a can be an inner surface and/or an outer surface of the helical-shaped growing substrate 140a. The helical directrix has an inside end and an outside end. The helical-shaped growing substrate 140a includes an opening 144a located on the outside end of the helix line, and a helical-shaped clearance 146a defined by the helical-shaped growing substrate 140a. The helical-shaped clearance 146a extends from the opening 144a to the center of the helical-shaped growing substrate 140a. The carbon nanotube array 120 grown on the helical surface correspondingly has a helical surface shape.

Figure 6:
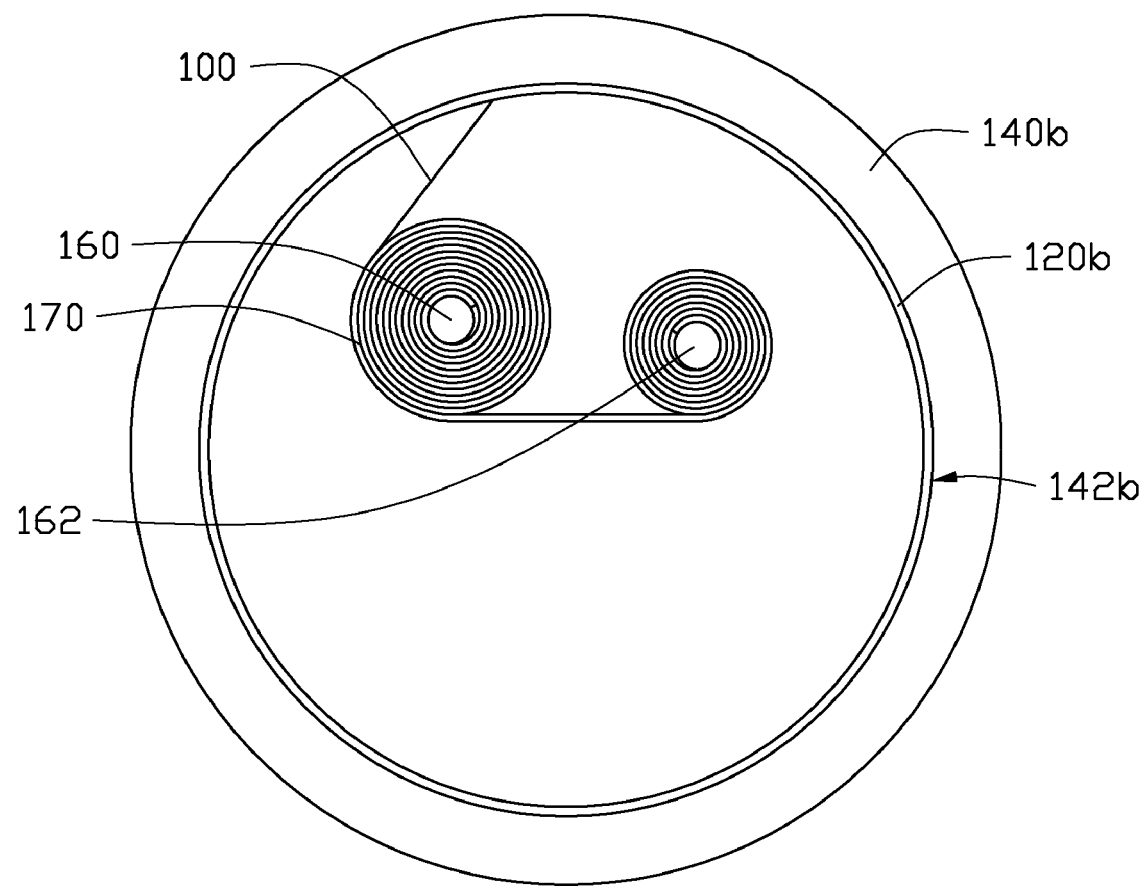
FIG. 6 is a schematic side view of a process of drawing the carbon nanotube film from the carbon nanotube array formed on an inner surface of a tubular growing substrate.

Referring to FIG. 6, in yet another embodiment, the growing substrate 140b is a closed tubular structure, such as a quartz tube, with a round-annular cross section, and the tubular carbon nanotube array 120b is formed on the inner surface of the growing substrate 140b to form a closed tubular carbon nanotube array 120b. The inner surface is the continuously curving surface 142b. The "tubular structure" is a hollow tube or the hollow tube with a linear shaped opening parallel to an axial direction of the hollow tube. The length of the linear shaped opening can be equal to the length of the hollow tube. The "closed tubular structure" is the tube without the linear shaped opening.

Figure 7:
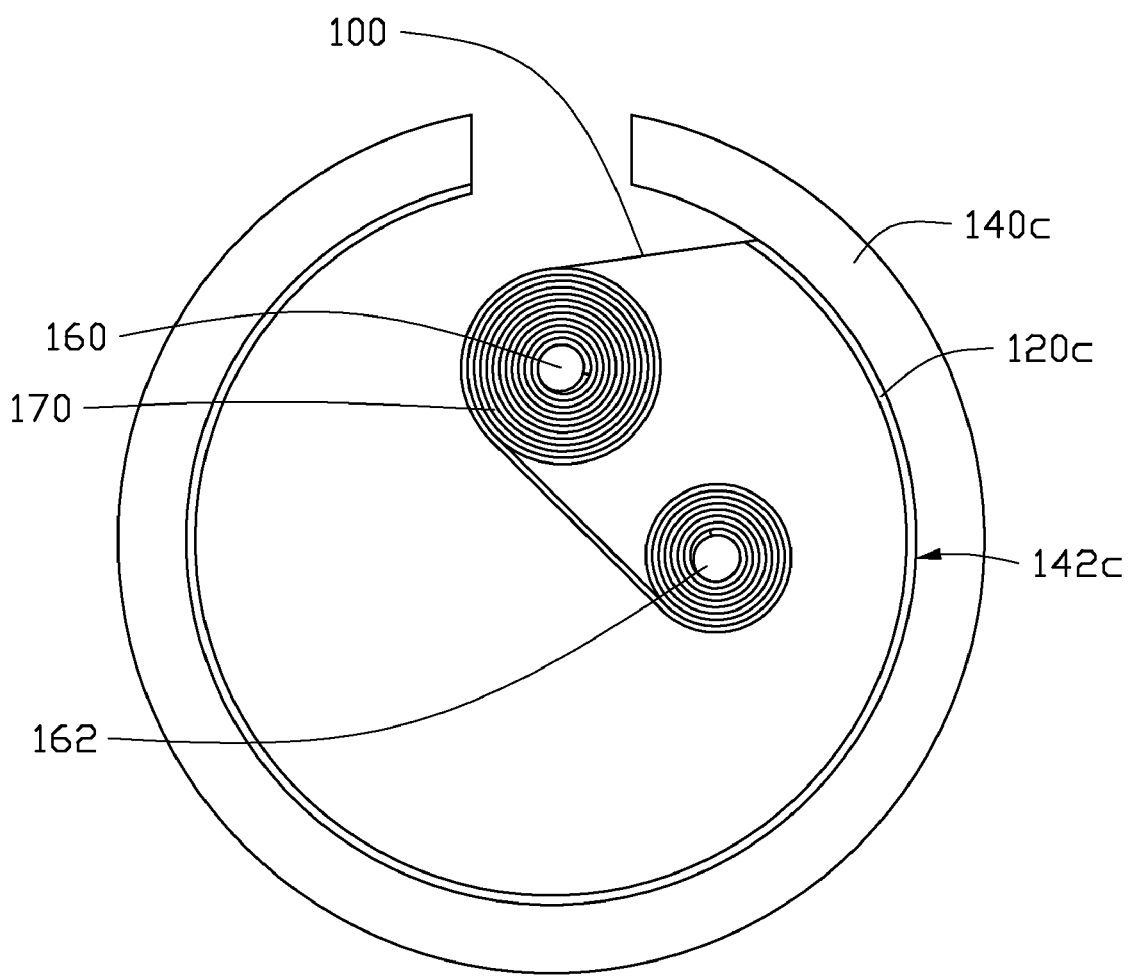
FIG. 7 is a schematic side view of a process of drawing the carbon nanotube film from the carbon nanotube array formed on an inner surface of the tubular growing substrate with a linear opening.

Referring to FIG. 7, in yet another embodiment, the growing substrate 140c is an opened tubular structure with a substantially C shaped cross section, and the tubular carbon nanotube array 120c is formed on the inner surface of the growing substrate 140c, to form an opened tubular carbon nanotube array 120c. The "opened tubular structure" is the tube with the linear shaped opening. The inner surface is the continuously curving surface 142c. The opened tubular carbon nanotube array 120c includes a linear shaped opening substantially parallel to an axial direction of the opened tubular carbon nanotube array 120c. The growing substrate 140c can also be a columnar structure including an outer surface as the continuously curving surface.

It is understood that the continuously curving surface of the growing substrate is not limited to the above mentioned surfaces. For example, the growing substrate may have a structure like a spring, a surface of the spring is the continuously curving surface defined by a three-dimensional spiral directrix, and the generatrix perpendicular to and moving along the spiral directrix. The three-dimensional spiral directrix is a three-dimensional curve that lies on a cylinder or cone, so that its angle to a plane perpendicular to the axis is constant.

The CVD reacting chamber may have a circular, elliptic, triangular, rectangular, other regular polygonal or irregular polygonal cross section. In one embodiment, the reacting chamber is a tube furnace with a gas inlet and a gas outlet respectively located on two opposite ends of the tube furnace. The growing substrate can be arranged in the tube furnace with the directrix substantially parallel to the lengthwise direction of the tube furnace. Further, a supporter such as a bracket can be arranged in the reacting chamber with the growing substrate. The supporter is used to fix the growing substrate in the reacting chamber. In one embodiment, the growing substrate can be suspended from the reacting chamber by using two brackets supporting two opposite ends of the growing substrate.

The protective gas can be made up of at least one of nitrogen ($N_2$), ammonia ($NH_3$), and a noble gas. The carbon source gas can be a hydrocarbon gas, such as ethylene ($C_2H_4$), methane ($CH_4$), acetylene ($C_2H_2$), ethane ($C_2H_6$), or any combination thereof.

The top surface of the carbon nanotube array is a continuously curving surface substantially parallel to the continuously curving surface of the growing substrate. The carbon nanotube array can be substantially grown on the entire continuously curving surface of the growing substrate. The carbon nanotubes of the carbon nanotube array can be selected from single-walled, double-walled, and/or multi-walled carbon nanotubes. Diameters of the single-walled carbon nanotubes approximately range from about 0.5 nanometers (nm) to about 50 nm. Diameters of the double-walled carbon nanotubes approximately range from about 1 nm to about 50 nm. Diameters of the multi-walled carbon nanotubes approximately range from about 1.5 nm to about 50 nm. The length of the carbon nanotubes can be approximately 2 microns to approximately 10 millimeters. In one embodiment, the length of the carbon nanotubes can range from about 100 microns to about 900 microns.

Figure 4:
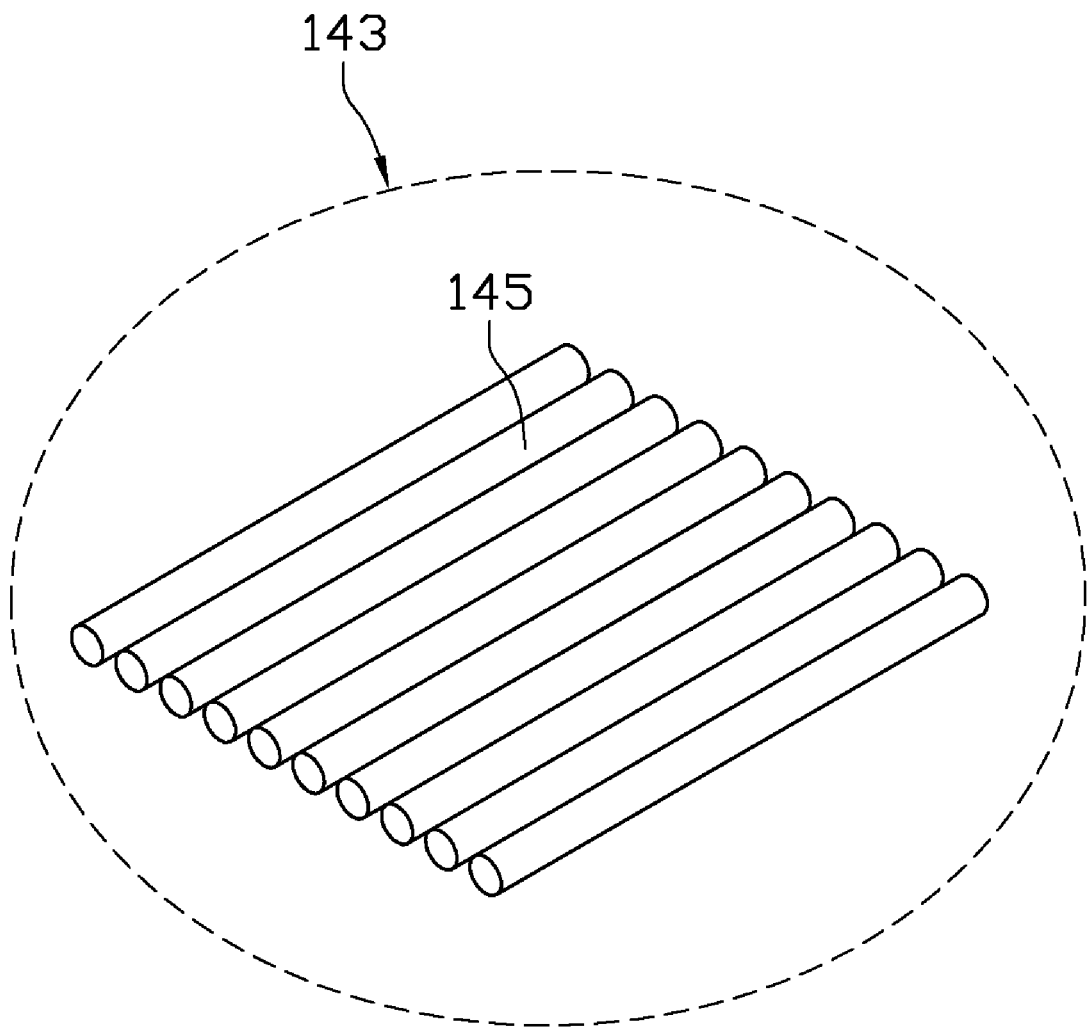
FIG. 4 is a schematic structural view of a carbon nanotube segment of the carbon nanotube film.
Figure 5:
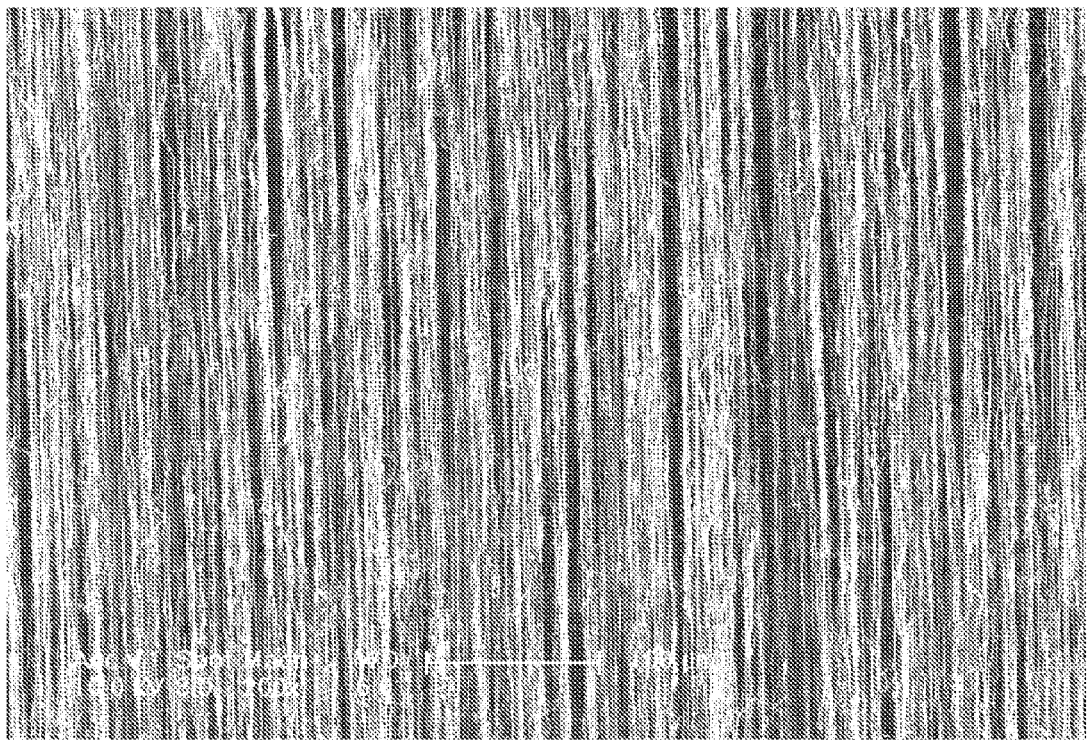
FIG. 5 shows a Scanning Electron Microscope (SEM) image of the carbon nanotube film.

Referring to FIG. 4, in step S2, the carbon nanotube segment 143 includes a single carbon nanotube or a plurality of carbon nanotubes 145 substantially parallel to each other. The drawing tool such as adhesive tape is used for selecting and drawing the carbon nanotube segment 143. The adhesive tape may contact with the carbon nanotubes in the carbon nanotube array to select the carbon nanotube segment 143. In one embodiment, the contact between the drawing tool and the carbon nanotube segment 143 is parallel to the generatrix of the continuously curving surface of the growing substrate. The initially selected carbon nanotube segment 143 can be located on the edge of the carbon nanotube array. In one embodiment, all the carbon nanotubes 145 located on the edge can be simultaneously selected from the carbon nanotube array to form the carbon nanotube segment 143 with a width equal to the length of the edge.

In step S3, the drawing tool moves away from the carbon nanotube array and pulls the carbon nanotube segments at an even speed. During the drawing process, as the initial carbon nanotube segment is drawn out, other carbon nanotube segments are also drawn out end-to-end due to the Van der Waals attractive force between ends of adjacent segments. In general, the initially selected carbon nanotubes are drawn out from the carbon nanotube array by the movement of the drawing tool. The following carbon nanotubes that are adjacent to the initially selected carbon nanotubes are then drawn out by Van der Waals attractive force between the following carbon nanotubes and the initially selected carbon nanotubes thereby forming the carbon nanotube film with carbon nanotubes joined end-to-end by Van der Waals attractive force therebetween. This process of drawing ensures that a continuous, uniform drawn carbon nanotube film. The width of the carbon nanotube film may be substantially equal to the width of the carbon nanotube segment 143.

In one embodiment, the drawing tool moves away from the carbon nanotube array 120 at a direction perpendicular to the generatrix of the continuously curving surface of the growing substrate. The drawn carbon nanotube film has an end connected to the carbon nanotube array and an opposite end connected to the drawing tool. An angle between the carbon nanotube film and the tangent plane of the continuously curving surface of the growing substrate is less than 90° at a connecting position between the carbon nanotube film and the carbon nanotube array. In one embodiment, during the drawing process, the angle may be kept to be less than 30°, that is, substantially all the carbon nanotubes are drawn from the carbon nanotube array at an angle smaller than 30° between the carbon nanotubes and the continuously curving surface. During the drawing step, there is a boundary line between the drawn carbon nanotube film and the carbon nanotube array, and the boundary line moves as more and more carbon nanotubes are drawn from the carbon nanotube array and thus the carbon nanotube array is consumed. In one embodiment, the boundary line is kept to be a straight line till all the carbon nanotubes are drawn from the growing substrate.

Referring to FIG. 15, the carbon nanotube film can have a large specific surface area (e.g., above 100 $m^2/g$). In one embodiment, the carbon nanotube film has a specific surface area in the range of about 200 $m^2/g$ to about 2600 $m^2/g$. In one embodiment, the carbon nanotube film has a specific weight of about 0.05 $g/m^2$. The thickness of the carbon nanotube film can be in a range from about 0.5 nm to about 100 microns. A transmittance of visible light of the carbon nanotube film can be above to 75%. The carbon nanotube film includes a plurality of carbon nanotubes that are arranged substantially parallel to a surface of the carbon nanotube film. A large number of the carbon nanotubes in the carbon nanotube film can be oriented along a preferred orientation, meaning that a large number of the carbon nanotubes in the carbon nanotube film substantially are arranged along the same direction. An end of one carbon nanotube is joined to another end of an adjacent carbon nanotube substantially arranged along the same direction, by Van der Waals attractive force. A small number of the carbon nanotubes are randomly arranged in the carbon nanotube film, and has a small if not negligible effect on the larger number of the carbon nanotubes in the carbon nanotube film substantially arranged along the same direction. It can be appreciated that some variation can occur in the orientation of the carbon nanotubes in the carbon nanotube film. Microscopically, the carbon nanotubes oriented substantially along the same direction may not be perfectly aligned in a straight line, and some curve portions may exist. It can be understood that contact between some carbon nanotubes located substantially side by side and oriented along the same direction cannot be totally excluded.

More specifically, the carbon nanotube film can include a plurality of successively oriented carbon nanotube segments joined end-to-end by Van der Waals attractive force therebetween. Each carbon nanotube segment includes a plurality of carbon nanotubes substantially parallel to each other, and joined by Van der Waals attractive force therebetween. The carbon nanotube segments can vary in width, thickness, uniformity and shape. The carbon nanotubes in the carbon nanotube film are also substantially oriented along a preferred orientation. The width of the carbon nanotube film relates to the carbon nanotube array from which the carbon nanotube film is drawn.

In step S3, an additional step of applying the drawn carbon nanotube film 100 to a protecting substrate can be added during the drawing process of the carbon nanotube film 100. The drawing tool can be removed after the carbon nanotube film 100 is applied to the protecting substrate. By applying the free-standing carbon nanotube film 100 to the protecting substrate, the carbon nanotube film 100 can be protected from being damaged or destroyed. Therefore, by using the additional step, the carbon nanotube film 100 can be easily drawn from a growing substrate with a complex shape. The protecting substrate can be rigid, and made of a material such as glass, quartz, or diamond; or can be flexible, and made of a material such as polymer or resin. The protecting substrate may have a film shape or a layer shape. In one embodiment, the protecting substrate is a polyethylene terephthalate (PET) film.

The present disclosure also discloses a method for drawing a carbon nanotube film 100 and simultaneously applying the drawn carbon nanotube film 100 to a substrate. The method includes steps of:

S11, providing a laminar protecting substrate wound on a first spool, the laminar protecting substrate including a first surface and a second surface, the first surface capable of having the carbon nanotube film adhered to it, the second surface is releasable from the carbon nanotube film;

S12, selecting a carbon nanotube segment having a predetermined width from the carbon nanotube array and drawing the carbon nanotube segment away from the carbon nanotube array to achieve the carbon nanotube film;

S13, applying the carbon nanotube film to the first surface of the laminar protecting substrate; and S14, unwinding the laminar protecting substrate from the first spool to continue to pull the carbon nanotube segment away from the carbon nanotube array thereby continue to apply the carbon nanotube film to the first surface of the laminar protecting substrate.

In step S11, the first spool includes an axis, and the axis of the first spool can be parallel to the generatrix of the continuously curving surface of the growing substrate where the carbon nanotube array is grown. The second surface has a release effect against the carbon nanotube film that enables the carbon nanotube film, which has been in contact with the second surface to be released from the second surface. The laminar protecting substrate can be a flexible film or layer made of polymer, metal, or paper, having a surface coated by a releasing coating. The polymer can be plastic or resin. The releasing coating can be made of silicon, cross-linkable silicone, paraffin, or Teflon. The surface of the laminar protecting substrate having the releasing coating is the second surface. The carbon nanotube film has a large specific surface area and is adhesive to the plastic, resin, metal, and paper, and less adhesive to the silicon, cross-linkable silicone, paraffin, and Teflon. Therefore, the carbon nanotube film 100 with a surface in contact with the first surface of the laminar protecting substrate and another surface in contact with the second surface of the laminar protecting substrate can be easily released from the second surface of the laminar protecting substrate. The surface of the laminar protecting substrate without the releasing coating is the first surface. Further, an adhesive layer can be coated on the flexible film or layer to form the first surface. The adhesive layer can be made of pressure sensitive adhesive, hot melt adhesive, or photosensitive adhesive.

In step S13, an end of the laminar protecting substrate can be previously unwound from the first spool. The carbon nanotube film 100 drawn by the drawing tool can be applied to the laminar protecting substrate.

In another embodiment, the end of the laminar protecting substrate can be directly used as the drawing tool to select the carbon nanotube segment, and the first surface of the end is adhesive to the carbon nanotubes and thereby allowing multiple carbon nanotubes to be gripped and pulled simultaneously. The first surface at the end is contacted with a section of the carbon nanotube array to select the carbon nanotube segment. In one embodiment, the contact between the laminar protecting substrate and the carbon nanotube segment is parallel to the generatrix of the continuously curving surface of the growing substrate.

In step S14, the first spool can be rotated and/or the end of the laminar protecting substrate having the carbon nanotube film applied thereto can be pulled to unwind the laminar protecting substrate from the first spool. The end of the laminar protecting substrate moves away from the carbon nanotube array to pull more and more carbon nanotube segments joined end to end away from the carbon nanotube array, thereby forming the carbon nanotube film with an extended length. The drawn carbon nanotube film gradually covers the first surface of the unwound laminar protecting substrate, and adheres on the first surface.

Further, an additional step of providing a second spool and winding the laminar protecting substrate with the carbon nanotube film applied thereon to the second spool can be further processed during the step S13.

Further, during the drawing of the carbon nanotube film from the carbon nanotube array, the carbon nanotubes are continuously drawn from the carbon nanotube array, and the carbon nanotube array are continuously consumed to be diminished in area. Therefore, the boundary line between the carbon nanotube film and the carbon nanotube array continuously moves away from the drawing direction. Accordingly, the first spool (and the second spool) can be moved parallel with the movement of the boundary line, to keep a fixed relative position and/or angle between the first spool and the boundary line. In one embodiment, the diameter of the first spool is smaller than the smallest curvature at a position of the continuously curving surface of the growing substrate.

Figure 3:
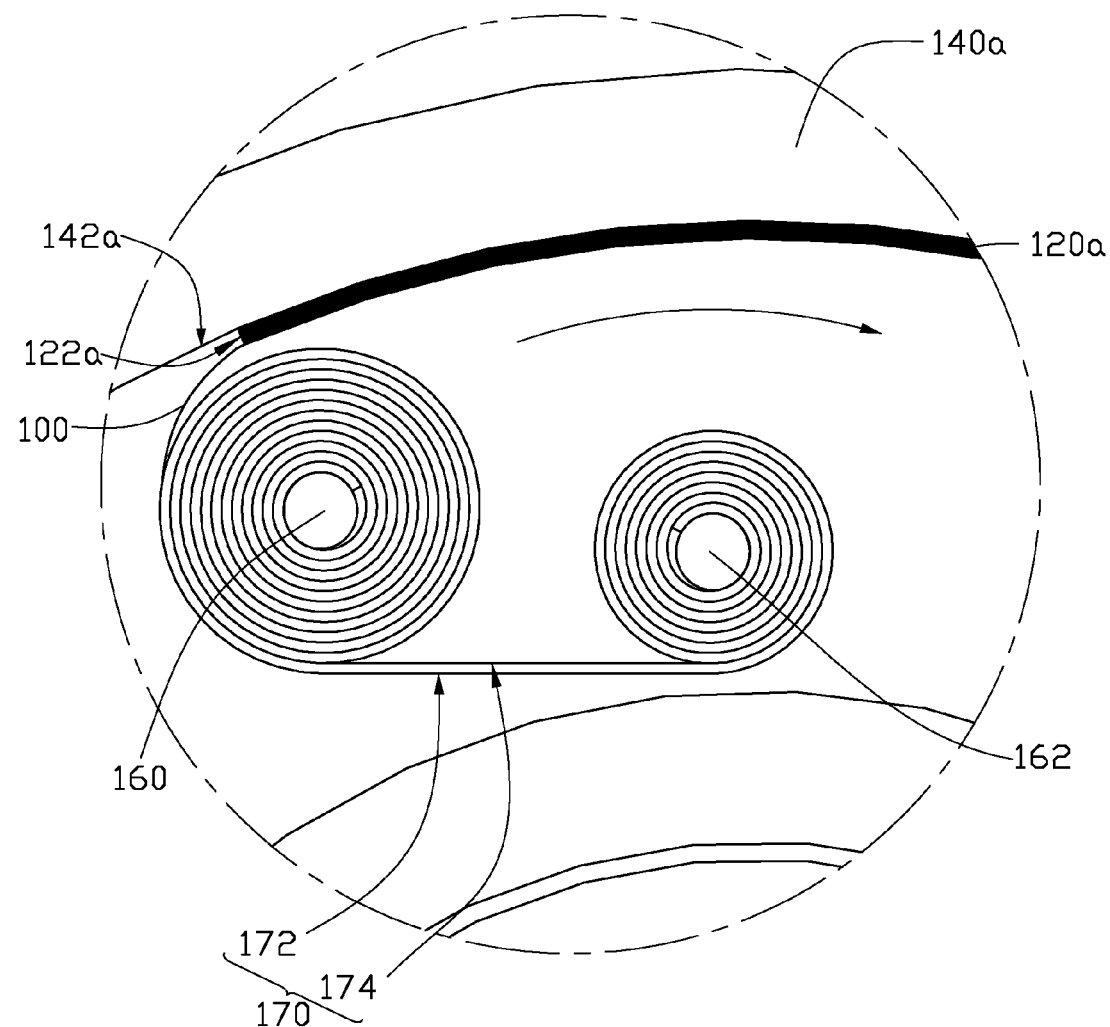
FIG. 3 is a partially enlarged view of FIG. 2.

Referring to FIG. 2 and FIG. 3, when the growing substrate 140a is the helical-shaped structure having the continuously curving surface 142a curved like a helix, the method includes steps of:

S21, providing a laminar protecting substrate 170 wound on a first spool 160 and a second spool 162, the laminar protecting substrate 170 including a first surface 172 and a second surface 174, the first surface 172 capable of having the carbon nanotube film 100 adhered to it, the second surface 174 capable of having the carbon nanotube film 100 released from it;

S22, selecting a carbon nanotube segment 143 from the carbon nanotube array 120a and drawing the carbon nanotube segment 143 away from the carbon nanotube array 120a to achieve the carbon nanotube film 100;

S23, applying the carbon nanotube film 100 to the first surface 172 of the laminar protecting substrate 170; and S24, rotating the first spool 160 to unwind the laminar protecting substrate 170 from the first spool 160 to continue to pull the carbon nanotube segment 143 away from the carbon nanotube array 120a thereby continue to apply the carbon nanotube film 100 to the first surface 172 of the laminar protecting substrate 170, and winding the laminar protecting substrate 170 with the drawn carbon nanotube film 100 thereon to the second spool 162; and S25, moving the first spool 160 to enter the clearance 146a from the opening 144a.

In step S21, the first spool 160 and the second spool 162 both include an axis, and the axes of the first spool 160 and the second spool 162 can be arranged substantially parallel to the generatrix of the continuously curving surface. The laminar protecting substrate 170 has a belt shape and is wound on the first spool 160.

In step S23, the end of the laminar protecting substrate 170 is unwound from the first spool 160 and having the first surface 172 at the end applied by the carbon nanotube film 100.

In step S24, the end of the laminar protecting substrate 170 moves away from the carbon nanotube array 120a to pull the carbon nanotube segment 143 away from the carbon nanotube array 120a. During the moving of the laminar protecting substrate 170, the carbon nanotube film 100 can be continued to be drawn from the carbon nanotube array 120a. In one embodiment, by moving and adjusting the position of the first spool 160, the angle between the drawn carbon nanotube film 100 and the continuously curving surface of the growing substrate 140a at the connecting position therebetween is kept smaller than 90°. Thereby, substantially all the carbon nanotubes are drawn from the carbon nanotube array 120a at an inclined angle towards the continuously curving surface.

The drawn carbon nanotube film 100 gradually covers the first surface 172 of the laminar protecting substrate 170. The laminar protecting substrate 170 with the drawn carbon nanotube film 100 thereon is wound to the second spool 162. The drawing force of the winding is applied to the carbon nanotube film 100 thereby drawing more and more carbon nanotube segments end-to-end by Van der Waals attractive force therebetween from the carbon nanotube array 120a, to increase the length of the carbon nanotube film 100. Referring to FIG. 3, the second surface 174 may be more adjacent to the second spool 162 than the first surface 172.

As more and more carbon nanotubes being continuously drawn from the carbon nanotube array 120a, the carbon nanotube array 120a is consumed and the area of the carbon nanotube array 120a is decreased. The boundary line between the carbon nanotube array 120a and the carbon nanotube film 100 moves contrary to the drawing direction and moves towards the center of the helical-shaped growing substrate 140a. In step S24, during the drawing of the carbon nanotube film 100 and winding the laminar protecting substrate 170 with the carbon nanotube film 100 to the second spool 162, the first spool 160 can move along with the boundary line and gradually enter the helical-shaped clearance 146a from the opening 144a. The first spool 160 can be parallel to the continuously curving surface during the motion. The second spool 162 can also move along with the first spool 160 into the helical-shaped clearance 146a from the opening 144a. It is to be noted that the size of the helical-shaped clearance 146a and the opening 144a is fit for receiving the first spool 160 and second spool 162 with the laminar protecting substrate 170 wound thereon.

Though the laminar protecting substrate 170 is wound on the second spool 162, the carbon nanotube film 100 can be released from the second surface 174 of the laminar protecting substrate 170, therefore, the laminar protecting substrate 170 with the carbon nanotube film 100 can be unwound from the second spool 162 to be flat. Accordingly, a double layered structure including a laminar protecting substrate 170 and a carbon nanotube film 100 covers and adheres to the first surface 172 can be achieved.

Referring to FIG. 6, when the growing substrate 140b is the closed tubular structure, the tubular shaped continuously curving surface 142b is the inner surface of the closed tubular structure, the method includes steps of:

S31, providing a laminar protecting substrate 170 wound on a first spool 160 and a second spool 162, the laminar protecting substrate 170 including a first surface 172 and a second surface 174, the first surface 172 capable of having the carbon nanotube film 100 adhered to it, the second surface 174 capable of having the carbon nanotube film 100 released from it;

S32, selecting a carbon nanotube segment 143 having a predetermined width from the carbon nanotube array 120b and drawing the carbon nanotube segment away 143 from the carbon nanotube array 120b to achieve the carbon nanotube film 100;

S33, applying the carbon nanotube film 100 to the first surface 172 of the laminar protecting substrate 170; and S34, rotating the first spool 160 to unwind the laminar protecting substrate 170 from the first spool 160 to continue to pull the carbon nanotube segment 143 away from the carbon nanotube array 120b thereby continue to apply the carbon nanotube film 100 to the first surface 172 of the laminar protecting substrate 170, and winding the laminar protecting substrate 170 with the drawn carbon nanotube film 100 thereon to the second spool 162; and S35, moving the first spool 160 at a same direction with a consuming direction of the carbon nanotube array 120b.

In step S31, the laminar protecting substrate 170, the first spool 160 and the second spool 162 are previously arranged in the closed tubular growing substrate 140b. The axes of the first spool 160 and the second spool 162 can be arranged substantially parallel to the axis of the tubular growing substrate 140b. Referring to FIG. 7, the growing substrate 140c can also be the opened tubular structure with a substantially C shaped cross section. By arranging the laminar protecting substrate 170, the first spool 160 and the second spool 162 in the opened tubular growing substrate 140c, the carbon nanotube film 100 can be drawn from the tubular carbon nanotube array 120c formed on the inner surface of the growing substrate 140c. It is understood that in all the methods described it is the tubular carbon nanotube array 120c can also be moved relative to the laminar protecting substrate 170, whether is it moving or not.

It is to be understood that, the growing substrate and the continuously curving surface having the carbon nanotube array grown thereon can also have other simple or complex shapes such as 3-D spiral, columnar or wavy. By using the above described method, the carbon nanotube film can be drawn from the carbon nanotube array grown on continuously curving surfaces and be simultaneously applied on the laminar protecting substrate.

Figure 8:
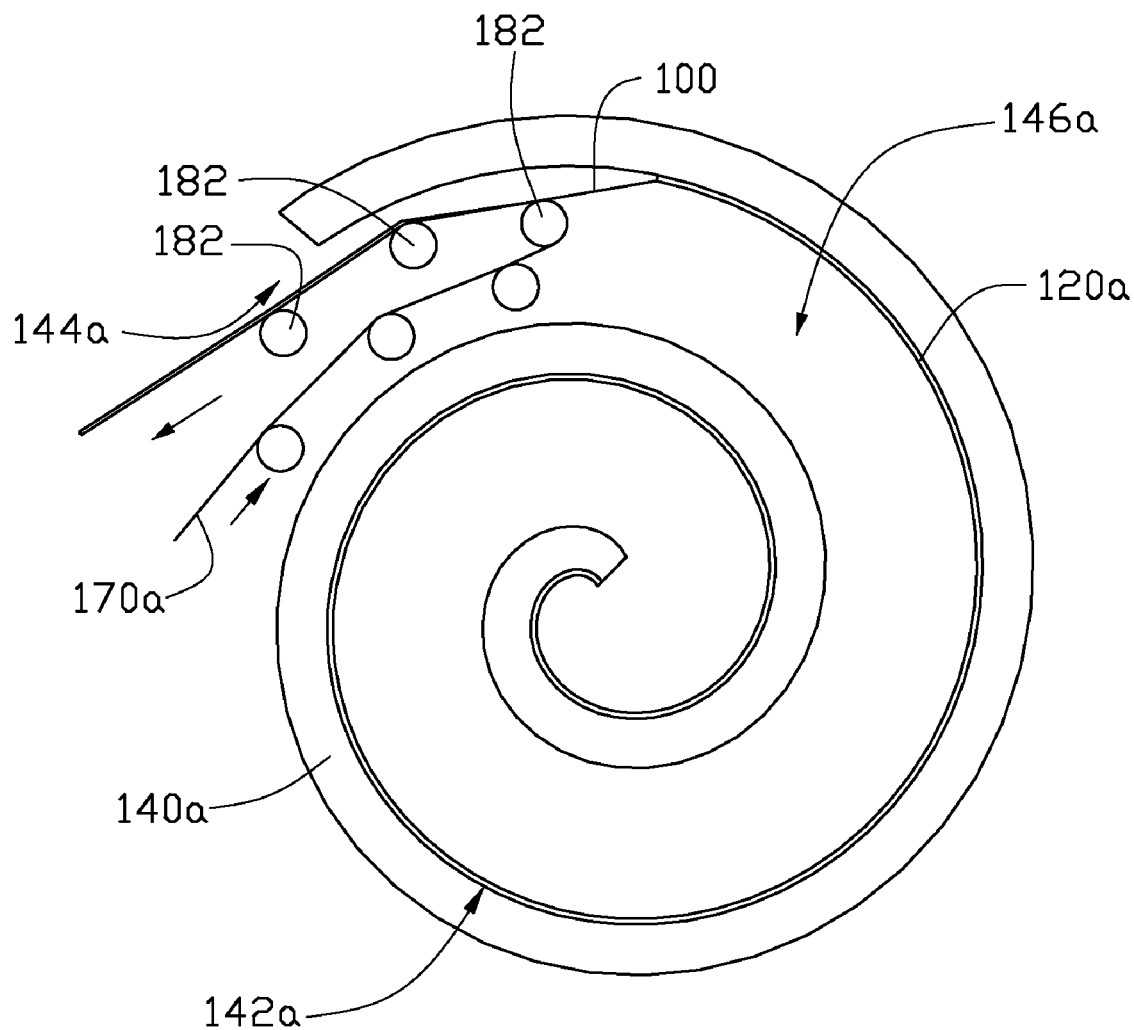
FIG. 8 is a schematic side view of a process of drawing the carbon nanotube film from the carbon nanotube array formed on the surface of the helical growing substrate.

Referring to FIG. 8, another embodiment of the method for drawing the carbon nanotube film from a carbon nanotube array grown on a complex shaped continuously curving surface 142a, includes steps of:

S41, forming a conveying route of the laminar protecting substrate 170a according to the shape of the continuously curving surface 142a by a plurality of rollers 182 and a laminar protecting substrate 170a;

S42, conveying the laminar protecting substrate 170a by the plurality of rollers 182 near the carbon nanotube array 120a;

S43, selecting a carbon nanotube segment 143 having a predetermined width from the carbon nanotube array 120a grown on the continuously curving surface 142a of the growing substrate 140a to achieve the carbon nanotube film 100 and applying the carbon nanotube film 100 to the laminar protecting substrate 170a;

S44, transferring the laminar protecting substrate 170a by the plurality of rollers 182 away from the carbon nanotube array 120a.

In one embodiment, the axes of the plurality of rollers 182 can be substantially parallel to the generatrix of the continuously curving surface 142a. When the growing substrate 140a is a helical-shaped structure having the continuously curving surface 142a curved like a helix, the conveying route can have a U shape including a entrance route, a top, and a return route. The return route and the entrance route are connected by the top. The U shaped conveying route is arranged in the clearance 146a. The laminar protecting substrate 170a is conveyed by the plurality of rollers 182 along the entrance route of the U shaped conveying route into the clearance 146a, and out of the clearance 146a along the return route of the U shaped conveying route. Therefore, after the drawn carbon nanotube film 100 is adhered to the first surface of the laminar protecting substrate 170a, the carbon nanotube film 100 can also be conveyed out of the clearance 146a along with the laminar protecting substrate 170a. The plurality of rollers 182 can be moved parallel along with the moving of the boundary line between the carbon nanotube film 100 and the carbon nanotube array 120a. Therefore, the U shaped conveying route can reach the center of the helical-shaped growing substrate 140a. The plurality of rollers 182 are arranged for supporting the laminar protecting substrate 170a and conveying the laminar protecting substrate 170a in and out of the clearance 146a by rolling and the parallel movement of the rollers 182. Accordingly, the carbon nanotube film 100 can be drawn from the carbon nanotube array 120a even grown at the center of the helical-shaped growing substrate 140a. The parallel moving speed of the rollers 182 is substantially equal to the consuming speed of the carbon nanotube array 120a.

For the reason that the growing substrate can have the larger surface area that can be used to grow the carbon nanotube array thereon than the planner shaped substrate, and efficiently use the space in the furnace, the larger sized carbon nanotube array can be formed. Therefore, the carbon nanotube film that is drawn from the larger sized carbon nanotube array can have the larger width and length. The carbon nanotube film with larger width can be used as a transparent conductive film in a large sized device, such as the touch panel and liquid crystal display.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method for making a carbon nanotube film, the method comprising:
providing a carbon nanotube array formed on a continuously curving surface of a growing substrate;
selecting a carbon nanotube segment from the carbon nanotube array using a drawing tool; and
drawing the carbon nanotube segment away from the carbon nanotube array to achieve the carbon nanotube film;
wherein the continuously curving surface is a cylindrical surface defined by a directrix and a generatrix moving along the directrix, the drawing tool moves away from the carbon nanotube array at a direction perpendicular to the generatrix, the method further comprises:
providing a laminar protecting substrate wound on a first spool the laminar protecting substrate including a first surface and a second surface, the first surface capable of having the carbon nanotube film adhered to it, the second surface capable of having the carbon nanotube film released from it;
applying the carbon nanotube film to the first surface of the laminar protecting substrate; and
unwinding the laminar protecting substrate from the first spool to continue to pull the carbon nanotube segment away from the carbon nanotube array thereby continue to apply the carbon nanotube film to the first surface of the laminar protecting substrate.

2. The method of claim 1, wherein during the drawing step, the carbon nanotube film has an end connected to the carbon nanotube array, an angle between the carbon nanotube film and a tangent plane of the continuously curving surface of the growing substrate is less than 90° at a connecting position between the carbon nanotube film and the carbon nanotube array.

3. The method of claim 2, wherein the angle is less than 30°.

4. The method of claim 1, wherein the carbon nanotube array is formed by steps of:
providing the growing substrate including the continuously curving surface;
forming a catalyst layer on the continuously curving surface; and
growing the carbon nanotube array on the continuously curving surface by using a chemical vapor deposition method.

5. The method of claim 4, wherein the growing substrate comprises a material selected from the group consisting of quartz, high temperature glass, P-type silicon, N-type silicon, metals with high melting points, and silicon dioxide.

6. The method of claim 1, further comprising a step of providing a second spool and winding the laminar protecting substrate with the carbon nantoube film applied thereon to the second spool.

7. The method of claim 6, further comprising a step of moving the first spool and the second spool parallel to the continuously curving surface.

8. The method of claim 7, wherein the growing substrate is a helical-shaped structure, the continuously curving surface of the growing substrate is a helical surface defined by a helix directrix and the generatrix perpendicular to and moving along the helical directrix, the growing substrate comprises an opening and a helical-shaped clearance defined by the growing substrate, the helical-shaped clearance extends from the opening to a center of the helical-shaped structure, during the drawing step the first spool and is moved to enter the helical-shaped clearance from the opening.

9. The method of claim 7, wherein the growing substrate is a tubular structure, the continuously curving surface is an inner surface of the tubular structure, the first spool and the second spool are arranged in the tubular structure, the first spool is moved at a same direction as a consuming direction of the carbon nanotube array.

10. The method of claim 1, wherein the laminar protecting substrate comprises a material selected from the group consisting of plastic, resin, metal, and paper.

11. The method of claim 1, wherein the second surface of the laminar protecting substrate has a releasing coating, the releasing coating comprises a material selected from the group consisting of silicon, crosslinkable silicone, paraffin, and Teflon.

12. The method of claim 1, wherein the first surface of the laminar protecting substrate has an adhesive layer.

13. The method of claim 1, wherein the carbon nanotube segment is parallel to the generatrix.

14. The method of claim 1 further comprising steps of:
forming a conveying route of the laminar protecting substrate according to a shape of the continuously curving surface by a plurality of rollers and the laminar protecting substrate;

conveying the laminar protecting substrate by the plurality of rollers near the carbon nanotube array;

transferring the laminar protecting substrate by the plurality of rollers away from the carbon nanotube array after the applying step.

15. The method of claim 14, wherein the growing substrate is a helical-shaped structure, comprising an opening and a helical-shaped clearance, the helical-shaped clearance extends from the opening to a center of the helical-shaped structure, the conveying route has a U shape comprising a entrance route, a top, and a return route connected the entrance route by the top, the laminar protecting substrate is conveyed by the plurality of rollers along the entrance route of the U shaped conveying route into the helical-shaped clearance, and out of the helical-shaped clearance along the return route of the U shaped conveying route.

* * * * *